US010629855B2

United States Patent
Kim et al.

(10) Patent No.: US 10,629,855 B2
(45) Date of Patent: Apr. 21, 2020

(54) MASK FOR MANUFACTURING AN ORGANIC LIGHT EMITTING DISPLAY DEVICE, THE MASK INCLUDING PLURALITY OF BRIDGES TO CONNECT BLOCKING PLATE TO MASK BODY

(71) Applicant: SAMSUNG DISPLAY CO., LTD., Yongin-si, Gyeonggi-do (KR)

(72) Inventors: Euigyu Kim, Yongin-si (KR); Dahee Jeong, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 77 days.

(21) Appl. No.: 15/715,255

(22) Filed: Sep. 26, 2017

(65) Prior Publication Data

US 2018/0090722 A1  Mar. 29, 2018

(30) Foreign Application Priority Data

Sep. 26, 2016  (KR) .................. 10-2016-0123381

(51) Int. Cl.
*H01L 51/56* (2006.01)
*H01L 51/00* (2006.01)
(Continued)

(52) U.S. Cl.
CPC ............ *H01L 51/56* (2013.01); *C23C 14/042* (2013.01); *C23C 14/12* (2013.01); *G04C 17/0091* (2013.01); *H01L 27/3225* (2013.01); *H01L 51/0011* (2013.01); *H01L 51/0021* (2013.01); *H01L 51/0096* (2013.01);
(Continued)

(58) Field of Classification Search
CPC ...................... H01L 21/0268; H01L 21/0334
See application file for complete search history.

(56) References Cited

U.S. PATENT DOCUMENTS 7,573,192 B2  8/2009  Kawabe
8,842,144 B2  9/2014  Kim
(Continued)

FOREIGN PATENT DOCUMENTS

JP  2006-147182  6/2006
KR  10-2003-0093959  12/2003
(Continued)

*Primary Examiner* — Matthew E. Gordon
(74) *Attorney, Agent, or Firm* — F. Chau & Associates, LLC

(57) ABSTRACT

A display device including a substrate in which at least one hole area is disposed. The substrate includes an active area. The display device also includes a thin film encapsulation (TFE) layer disposed on the substrate. A pixel including a plurality of sub-pixels is disposed on the active area. A plurality of first and second pixel groups each include the sub-pixels. The first and second pixel groups are disposed along a plurality of first and second lines of the active area, respectively. The first and second lines are alternated in the active area. A first deposition portion forming the common layer or the common electrode is disposed in the first pixel groups disposed along the first lines of the active area. A second deposition portion forming the common layer or the common electrode is disposed in the second pixel groups disposed along the second lines of the active area.

6 Claims, 15 Drawing Sheets

(51) Int. Cl.
- *H01L 51/52* (2006.01)
- *H01L 27/32* (2006.01)
- *C23C 14/04* (2006.01)
- *C23C 14/12* (2006.01)
- *G04C 17/00* (2006.01)

(52) U.S. Cl.
CPC .......... *H01L 51/52* (2013.01); *H01L 51/5225* (2013.01); *H01L 51/5256* (2013.01); *H01L 27/3211* (2013.01); *H01L 27/3216* (2013.01); *H01L 27/3244* (2013.01); *H01L 27/3246* (2013.01); *H01L 27/3258* (2013.01); *H01L 27/3276* (2013.01); *H01L 2227/323* (2013.01)

(56) References Cited

U.S. PATENT DOCUMENTS

| | | | |
|---|---|---|---|
| 2005/0142451 A1* | 6/2005 | You | G03F 9/7076 430/5 |
| 2015/0179710 A1 | 6/2015 | Choi et al. | |

FOREIGN PATENT DOCUMENTS

| KR | 10-2004-0052789 | 6/2004 |
|---|---|---|
| KR | 10-2013-0007278 | 1/2013 |
| KR | 10-2015-0073743 | 7/2015 |

\* cited by examiner

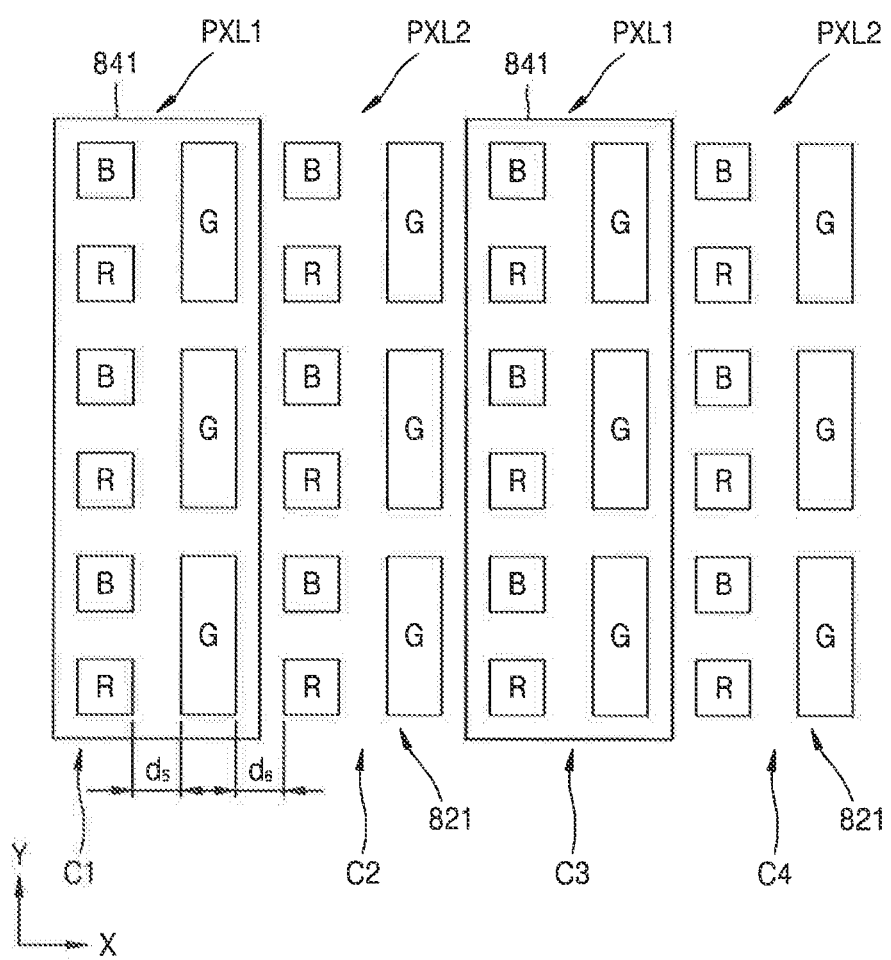

MASK FOR MANUFACTURING AN ORGANIC LIGHT EMITTING DISPLAY DEVICE, THE MASK INCLUDING PLURALITY OF BRIDGES TO CONNECT BLOCKING PLATE TO MASK BODY

CROSS-REFERENCE TO RELATED APPLICATION

This application claims priority under 35 U.S.C. § 119 to Korean Patent Application No. 10-2016-0123381, filed on Sep. 26, 2016 in the Korean Intellectual Property Office, the disclosure of which is incorporated by reference herein in its entirety.

TECHNICAL FIELD

Exemplary embodiments of the present invention relate to a display device, and more particularly to an organic light-emitting display device, a mask for manufacturing the same, and a method of manufacturing the same.

DISCUSSION OF RELATED ART

Display devices may be used in mobile apparatuses such as smartphones, laptop personal computers (PCs), digital cameras, camcorders, portable information terminals, notebooks, tablet personal computers (PCs), and watches. Display devices may also be used in electronic apparatuses such as desktop computers, televisions (TVs), outdoor billboards, exhibition display devices, dashboards, and head-up displays (HUDs).

Relatively thin display devices have been developed.

Flexible display devices are easy to carry and can be applied to apparatuses having various shapes. A flexible display device may be based on organic light-emitting display technology. A flexible display device may be connected to various mechanical parts.

A display device may have various shapes. In such a display device, thin-film patterns may be formed on a substrate by using a mask. However, when a display device has a relatively unusual shape, a process of forming a thin-film layer of a desired pattern on a substrate may be difficult.

SUMMARY

Exemplary embodiments of the present invention include an organic light-emitting display device, a mask for manufacturing the same, and a method of manufacturing the same, in which a deposition material may be deposited relatively easily on display devices having various shapes.

One or more exemplary embodiments of the present invention provide a display device. The display device includes a substrate and a thin film encapsulation (TFE) layer. At least one hole area is disposed in the substrate. The substrate includes an active area. The substrate also includes a pixel electrode, an intermediate layer, and a common electrode. The intermediate layer includes an organic emissive layer and at least one common layer. The thin film encapsulation layer (TEE) is disposed on the substrate. A pixel having a plurality of sub-pixels is disposed on the active area. An organic emissive layer is disposed in each of the sub-pixels. A plurality of first pixel groups and a plurality of second pixel groups each include the plurality of sub-pixels. The first pixel groups and the second pixel groups are disposed along a plurality of first and second lines of the active area, respectively. The first and second lines are alternately disposed in the active area. A first deposition portion forming the common layer or the common electrode is disposed in the first pixel groups disposed along the first lines of the active area. A second deposition portion forming the common layer or the common electrode is disposed in the second pixel groups disposed along the second lines of the active area.

The first deposition portion forming the common layer or the common electrode and the second deposition portion forming the common layer or the common electrode may be at least partially connected to each other.

A boundary line may be disposed in each region where the first deposition portion for the common layer or the common electrode and the second deposition portion for the common layer or the common electrode are connected to each other.

A first interval between the sub-pixels disposed in the first lines or the second lines may be substantially equal to a second interval between a pixel of the first pixel group disposed in the first lines and a pixel of the second pixel group disposed in the second lines adjacent to the first pixel group.

A third interval between the sub-pixels disposed in the first lines or the second lines may be smaller than a fourth interval between a pixel of the first pixel group disposed in the first lines and a pixel of the second pixel group disposed in the second lines adjacent to the first pixel group.

The active area may have a loop shape.

The hole area may be disposed in the active area.

The hole area may be surrounded by the active area.

The hole area may penetrate each of the substrate and the thin film encapsulation (TFE) layer.

One or more exemplary embodiments provide a mask for manufacturing a display device. The display device includes at least one hole area, a pixel electrode, an intermediate layer, and a common electrode. The at least one hole area is disposed on a substrate. The intermediate layer includes an organic emissive layer and at least one common layer. The mask includes a mask body, a blocking plate, and a plurality of bridges. The mask body has a deposition hole. The blocking plate is disposed in the deposition hole in an island shape. The plurality of bridges are configured to connect the mask body to the blocking plate and divide the deposition hole.

Bridge portions of the plurality of bridges may be disposed across the deposition hole and connect an inner peripheral surface of the mask body surrounding the deposition hole to an outer peripheral surface of the blocking plate. An interval between the bridge portions may correspond to each space where the deposition hole is divided.

The interval between the bridge portions may correspond to a size of a pixel group having a plurality of sub-pixels disposed along a first line on an active area of the substrate.

The bridge portions may have a stripe shape extending in a first direction of the mask body corresponding to the first line on the active area. The bridge portions may be spaced apart from each other by the interval in a second direction.

A position of the blocking plate may correspond to a position of a hole on the substrate.

A position of the deposition hole may correspond to a position of the active area on the substrate, and the deposition hole may have a loop shape.

One or more exemplary embodiments of the present invention provide a method of manufacturing a display device. The display device has at least one hole area, a pixel electrode, an intermediate layer, and a common electrode. The at least one hole area is disposed on the substrate. The intermediate layer includes an organic emissive layer and at least one common layer. The method includes depositing a deposition material on a pixel having a plurality of subpixels disposed on an active area of a substrate using a mask. The mask includes a mask body, a blocking plate, and a plurality of bridges. The mask body has a deposition hole. The blocking plate is disposed in the deposition hole in an island shape. The plurality of bridges are configured to connect the mask body to the blocking plate. The plurality of bridges are also configured to divide the deposition hole.

The method may further include arranging a plurality of bridges on a plurality of first pixel groups disposed along first lines of the active area, and arranging an interval corresponding to a space, in which the deposition hole is divided, on a plurality of second pixel groups disposed along second lines of the active area. A first process of passing the deposition material through the interval to deposit a second deposition portion for the common layer or the common electrode on the plurality of second pixel groups is performed. A plurality of bridges on the plurality of second pixel groups disposed along second lines of the active area are arranged. The interval on the plurality of first pixel groups disposed along first lines of the active area are arranged. A second process of passing the deposition material through the interval to deposit a first deposition portion for the common layer or the common electrode on the plurality of first pixel groups is performed.

The first deposition portion for the common layer or the common electrode and the second deposition portion for the common layer or the common electrode may be at least partially connected to each other. A boundary line may be disposed in each region where the first deposition portion and the second deposition portion are connected to each other.

A position of the blocking plate may correspond to a position of a hole through which the deposition material does not pass.

The deposition material may have a loop shape corresponding to the active area on the substrate.

BRIEF DESCRIPTION OF THE DRAWINGS

These and/or other aspects will become apparent and more readily appreciated from the following description of the exemplary embodiments, taken in conjunction with the accompanying drawings, in which:

FIG. 14 is a cross-sectional view illustrating a first operation of forming a deposition portion according to an exemplary embodiment of the present invention.

DETAILED DESCRIPTION OF THE EMBODIMENTS

Figure 1:
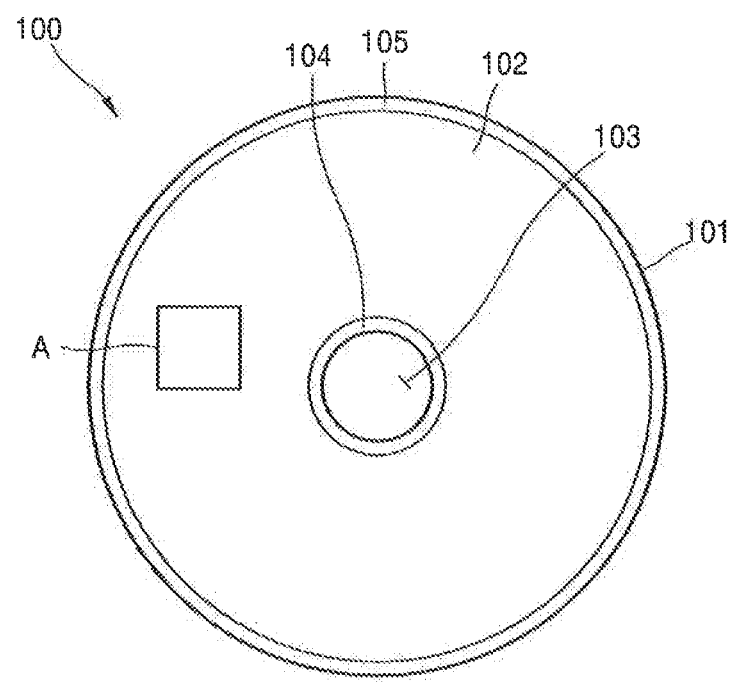
FIG. 1 is a plan view illustrating an organic light-emitting display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

It is to be understood that the X-axis, the Y-axis and the Z-axis are not limited to three axes of the rectangular coordinate system. For example, the X-axis, the Y-axis, and the Z-axis may be substantially perpendicular to one another, or may refer to directions that are not substantially perpendicular to one another.

Hereinafter, a display apparatus according to one or more exemplary embodiments of the present invention will be described in detail with reference to the accompanying drawings. Like reference numerals may refer to like elements throughout the drawings and the specification, and redundant descriptions thereof may be omitted.

FIG. 1 is a plan view illustrating an organic light-emitting display device 100 according to an exemplary embodiment of the present invention.

Referring to FIG. 1, the organic light-emitting display device 100 may include a substrate 101. The substrate 101 may have a circular shape; however, exemplary embodiments of the present invention are not limited thereto. An active area 102 may be disposed on the substrate 101. The active area 102 may include an area on which an image is displayed. The active area 102 may be disposed on the substrate 101, for example, in a loop shape. In one or more exemplary embodiments of the present invention, the active area 102 may have a ring shape.

A hole 103 may be disposed in the substrate 101. For example, the hole 103 may be disposed approximately in the center of the substrate 101. The hole 103 may have a circular shape; however, exemplary embodiments of the present invention are not limited thereto. Furthermore, a single hole 103 disposed in the center of the substrate 101 will be described in more detail below; however, exemplary embodiments of the present invention are not limited thereto. For example, a plurality of holes 103 may be disposed in the substrate 101. The hole 103 may be disposed inside the active area 102. The hole 103 may be surrounded by the active area 102.

A first inactive area 104 may be disposed between the active area 102 and the hole 103. The first inactive area 104 may surround the hole 103. The first inactive area 104 may provide structural stability to the organic light-emitting display device 100, for example, when a plurality of elements are formed on the substrate 101. A second inactive area 105 may be disposed in an outermost periphery of the substrate 101.

The organic light-emitting display device 100 may be used in a watch.

In one or more exemplary embodiments of the present invention, the organic light-emitting display device 100 may be applied, for example, to a dashboard, a smart phone, or a tablet personal computer (PC).

Figure 2A:
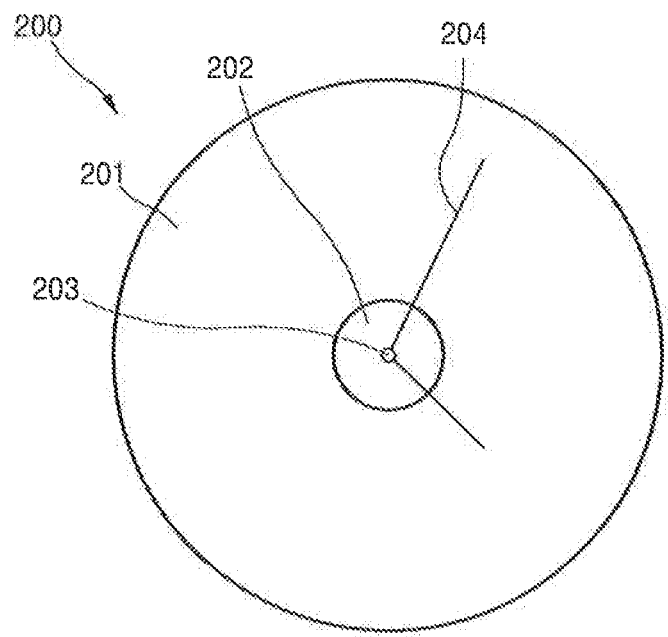
FIG. 2A is a plan view illustrating mechanical parts configured to be connected to the organic light-emitting display device of FIG. 1 according to an exemplary embodiment of the present invention.
Figure 2B:
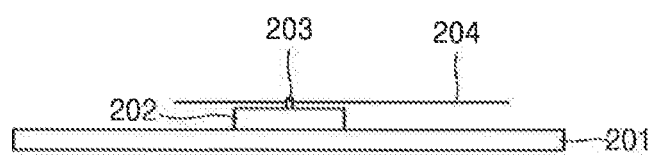
FIG. 2B is a cross-sectional view illustrating mechanical parts of FIG. 2A according to an exemplary embodiment of the present invention.

FIG. 2A is a plan view illustrating mechanical parts to be connected to a display device of FIG. 1 according to an exemplary embodiment of the present invention, FIG. 2B is a cross-sectional view illustrating mechanical parts of FIG. 2A according to an exemplary embodiment of the present invention.

Referring to FIGS. 2A and 2B, the mechanical parts 200 may be watch parts.

The mechanical parts 200 may include a watch body 201, a watch shaft 202, an arbor 203, and hands 204. The watch shaft 202 may be disposed in the watch body 201. For example, the watch shaft 202 may be disposed approximately in the center of the watch body 201. The arbor 203 may be disposed on the watch shaft 202. Hands 204 of the watch may be disposed in the arbor 203.

Figure 3A:
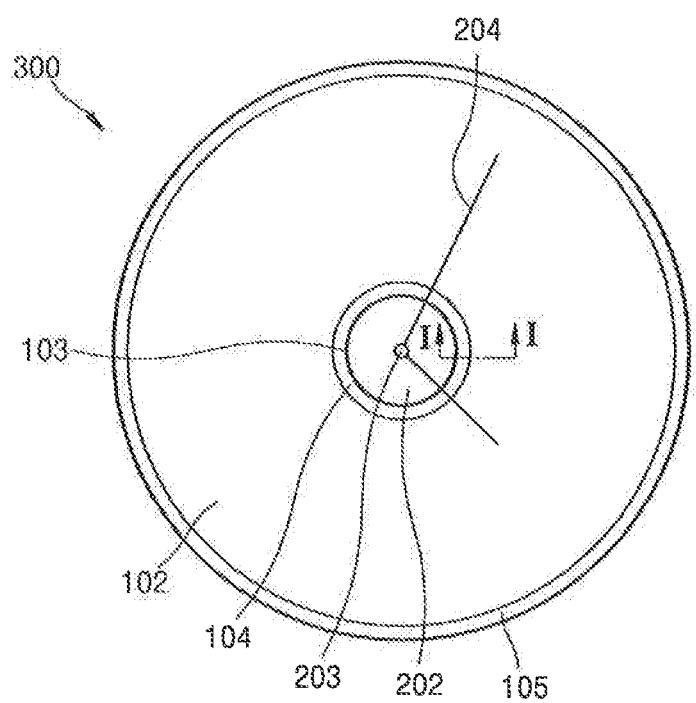
FIG. 3A is a plan view illustrating a structure in which an organic light-emitting display device of FIG. 1 is connected to mechanical parts of FIG. 2A according to an exemplary embodiment of the present invention.
Figure 3B:
FIG. 3B is a cross-sectional view illustrating a structure of FIG. 3A according to an exemplary embodiment of the present invention.

FIG. 3A is a plan view illustrating a structure in which a display device of FIG. 1 is connected to mechanical parts of FIG. 2A according to an exemplary embodiment of the present invention. FIG. 3B is a cross-sectional view illustrating a structure of FIG. 3A according to exemplary embodiments of the present invention.

Referring to FIGS. 3A and 3B, a structure 300 may include the display device 100 and the mechanical parts 200. The display device 100 may be disposed above the mechanical parts 200.

The watch body 201 may be disposed below the substrate 101. A lower surface of the substrate 101 may contact an upper surface of the watch body 201. The watch shaft 202 may be inserted through the hole 103 formed in the center of the substrate 101. A size of the watch shaft 202 may correspond to a size of the hole 103. The watch shaft 202 may be surrounded by the inactive area 104. The hands 204 disposed on the watch shaft 202 may be disposed above the substrate 101.

Figure 4:
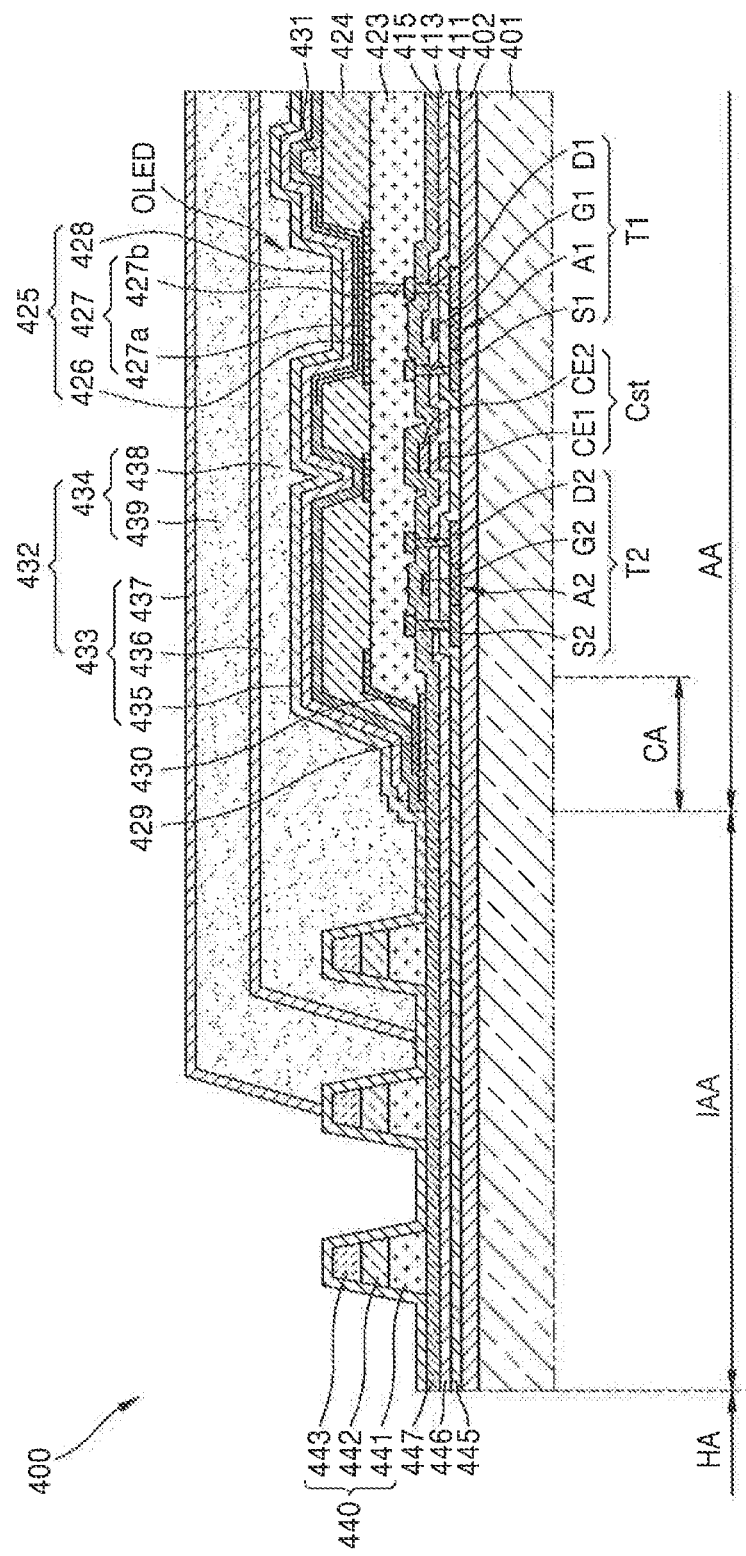
FIG. 4 is a partial enlarged cross-sectional view illustrating an organic light-emitting display device according to an exemplary embodiment of the present invention.

The structure 300 may provide a desired screen by using the organic light-emitting display device 100. FIG. 4 is a partial enlarged cross-sectional view illustrating an organic light-emitting display device according to an exemplary embodiment of the present invention.

In one or more exemplary embodiments of the present invention, an organic light-emitting display device 400 may correspond to a portion of the structure 300 taken along a line I-I' of FIG. 3A.

Referring to FIG. 4, the organic light-emitting display device 400 may include a substrate 401 and a thin film encapsulation (TFE) layer 432. The thin film encapsulation layer (TFE) 432 may be disposed above the substrate 401.

The substrate 401 may include an active area AA, an inactive area IAA, and a circuit area CA. An image may be displayed in the active area AA. The inactive area IAA may extend outwardly from the active area AA. The circuit area CA may be disposed around the active area AA. The inactive area IAA may surround the active area AA. The active area AA and the inactive area IAA may each be disposed on the substrate 101, for example, in a loop shape.

A hole area HA may be disposed outside the inactive area IAA. The hole area HA may be disposed approximately in the center of the substrate 401. The hole area HA may correspond to an area in which the hole 103 of FIG. 3A is disposed. The hole area HA may be disposed inside the active area AA. The hole area HA may be surrounded by the active area AA. The hole area HA may penetrate each of the substrate 401 and the TFE layer 432.

The substrate 401 may be a glass substrate, a polymer substrate, a flexible film, a metal substrate, or a composite substrate thereof. The substrate 401 may be transparent, opaque, or semi-transparent.

In one or more exemplary embodiments of the present invention, the substrate 401 may include a polymer material including polyimide (PI), polycarbonate (PC), polyethersulphone (PES), polyethylene terephthalate (PET), polyethylenenaphthalate (PEN), polyarylate (PAR), and/or fiber glass reinforced plastic (FRP).

A barrier layer 402 may be disposed above the substrate 401. The barrier layer 402 may cover an upper surface of the substrate 401. The barrier layer 402 may include an inorganic material or an organic material. The barrier layer 402 may include a single-layered film or a multi-layered film.

A plurality of thin-film transistors (TFTs) may be disposed in the active area AA, for example, above the barrier layer 402. The plurality of TFTs may be disposed in the active area AA or the circuit area CA. The plurality of TFTs may include a first TFT T1 and a second TFT T2.

The first TFT T1 may include a first semiconductor layer A1, a first gate electrode G1, a first source electrode S1, and a first drain electrode D1. The second TFT T2 may include a second semiconductor layer A2, a second gate electrode G2, a second source electrode S2, and a second drain electrode D2.

A first gate insulating film 411 may be disposed between the first semiconductor layer A1 and the first gate electrode G1. The first gate insulating film 411 may provide insulation between the first semiconductor layer A1 and the first gate electrode G1. The first gate insulating film 411 and a second gate insulating film 413 may each be disposed between the second semiconductor layer A2 and the second gate electrode G2. The first gate insulating film 411 and the second gate insulating film 413 may provide insulation between the second semiconductor layer A2 and the second gate electrode G2. The first gate insulating film 411 and the second gate insulating film 413 may be stacked, for example, in a vertical direction from the substrate 401.

Due to the first gate insulating film 411 and the second gate insulating film 413, the first gate electrode G1 and the second gate electrode G2 might not be disposed on the same layer. The first gate insulating film 411 and the second gate insulating film 413 may each include substantially the same material. In one or more exemplary embodiments of the present invention, the first gate insulating film 411 and the second gate insulating film 413 may each be inorganic films.

The first gate electrode G1 and the second gate electrode G2 may each include substantially the same material. In one or more exemplary embodiments of the present invention, each of the first gate electrode G1 and the second gate electrode G2 may include a metal material. The metal material may have a relatively high conductivity. For example, each of the first gate electrode GI and the second gate electrode G2 may include Au, Ag, Cu, Ni, Pt, Pd, Al, Mo, or Cr. Each of the first gate electrode G1 and the second gate electrode G2 may include an alloy such as Al:Nd and Mo:W. The first gate electrode G1 and the second gate electrode G2 may each include a single layered film or a multi-layered film.

An interlayer insulating film 415 may be disposed above the second gate electrode G2. The interlayer insulating film 415 may include an inorganic film or an organic film.

The first source electrode S1 and the first drain electrode D1 may each be disposed above the interlayer insulating film 415. The first source electrode S1 and the first drain electrode D1 may each be connected to the first semiconductor layer A1, for example, through a contact hole. The second source electrode S2 and the second drain electrode D2 may each be disposed above the interlayer insulating film 415. The second source electrode S2 and the second drain electrode D2 may each be connected to the second semiconductor layer A2, for example, through a contact hole.

The first source electrode S1, the first drain electrode D1, the second source electrode S2, and the second drain electrode D2 may each include substantially the same material. In one or more exemplary embodiments of the present invention, the first source electrode S1, the first drain electrode D1, the second source electrode S2, and the second drain electrode D2 may each include a metal, an alloy, metal nitride, conductive metal oxide, a transparent conductive material, or any combination thereof.

A storage capacitor Cst may be disposed above the substrate 401. A plurality of storage capacitors Cst may be disposed above the substrate 401. The storage capacitor Cst may include a first capacitor electrode CE1, a second capacitor electrode CE2, and a dielectric layer. The dielectric layer may be disposed between the first capacitor electrode CE1 and the second capacitor electrode CE2. In one or more exemplary embodiments of the present invention, the dielectric layer may correspond to the second gate insulating film 413. The first capacitor electrode CE1 and the first gate electrode G1 may include substantially the same material. The second capacitor electrode CE2 and the second gate electrode G2 may include substantially the same material.

A planarization film 423 may cover each of the first and second TFTs T1 and T2 and the storage capacitor Cst. The planarization film 423 may be disposed above the interlayer insulating film 415. The planarization film 423 may include an inorganic material or an organic material.

The first TFT T1 may be electrically connected to an organic light-emitting device (OLED) 425. The organic light-emitting device (OLED) 425 may display an image.

The OLED 425 may be disposed above the planarization film 423. The OLED 425 may include a pixel electrode 426, an intermediate layer 427, and a common electrode 428.

The pixel electrode 426 may be an anode. The pixel electrode 426 may include various conductive materials. The pixel electrode 426 may include a transparent electrode or a reflective electrode. For example, when the pixel electrode 426 includes a transparent electrode, the pixel electrode 426 may include a transparent conductive film. When the pixel electrode 426 includes a reflective electrode, the pixel electrode 426 may include a reflective film and a transparent conductive film. The transparent conductive film may be disposed above the reflective film.

A pixel defining layer 424 may be disposed above the planarization film 423. The pixel defining layer 424 may cover a part of the pixel electrode 426. The pixel defining layer 424 may surround an edge of the pixel electrode 426. Thus, the pixel defining layer 424 may define an emission region of each sub-pixel. The pixel electrode 426 may be patterned in each sub-pixel.

The pixel defining layer 424 may include an organic material or an inorganic material. The pixel defining layer 424 may include a single-layered film or a multi-layered film.

The intermediate layer 427 may be disposed in a region exposing the pixel electrode 426, for example, by etching a part of the pixel defining layer 424.

The intermediate layer 427 may include an organic emissive layer 427a and a common layer 427b. The organic emissive layer 427a may be disposed in each sub-pixel. The common layer 427b may be disposed over each of the active area AA and the inactive area IAA. The common layer 427b may include at least one of a hole injection layer (HIL), a hole transport layer (HTL), an electron transport layer (ETL), or an electron injection layer (EIL).

In one or more exemplary embodiments of the present invention, the intermediate layer 427 may include the organic emissive layer 427a. The intermediate layer 427 may further include various functional layers.

The common electrode 428 may be a cathode. The common electrode 428 may be disposed over each of the active area AA and the inactive area IAA. The common electrode 428 may include a transparent electrode or a reflective electrode. For example, when the common electrode 428 includes a transparent electrode, the common electrode 428 may include a conductive layer and a transparent conductive film. The conductive layer may include a metal having a low work function relative to that of the transparent conductive film and a compound thereof. The metal may have a relatively low work function. The transparent conductive film may be disposed above the conductive layer. When the common electrode 428 includes a reflective electrode, the common electrode 428 may include a conductive layer. The conductive layer may include a metal and a compound thereof.

In one or more exemplary embodiments of the present invention, a spacer 431 may be disposed around the sub-pixel above the pixel defining layer 424. The spacer 431 may be disposed between adjacent sub-pixels. The common layer 427*b* and the common electrode 428 may be stacked on an outer surface of the spacer 431.

In one or more exemplary embodiments of the present invention, a plurality of sub-pixels may be disposed above the substrate 401. For example, a red color, a green color, a blue color, or a white color may be produced according to each sub-pixel. However, exemplary embodiments of the present invention are not limited thereto. Pixels each having a plurality of sub-pixels may be disposed in substantially the entire active area AA.

Various circuit lines may be disposed in the circuit area CA. For example, power supply patterns, electrostatic discharge prevention patterns, and various circuit patterns may be disposed in the circuit area CA.

A power line 429 may be disposed above the interlayer insulating film 415. The power line 429 may be a line to which external power is supplied, for example, from an external power source. The power line 429, the first source electrode S1, the first drain electrode D1, the second source electrode S2, and the second drain electrode D2 may include substantially the same material. In one or more exemplary embodiments of the present invention, the power line 429 may have a three-layered structure of titanium/aluminum/titanium (Ti/Al/Ti).

The circuit line 430 may be disposed above the planarization film 423. The circuit line 430 and the pixel electrode 426 may include substantially the same material.

The power line 429 and the circuit line 430 may be disposed above different layers. An end of the circuit line 430 may contact the power line 429. At least a part of the circuit line 430 may overlap the power line 429. An end of the common layer 427*b* may be disposed above the circuit line 430. An end of the common electrode 428 may be disposed above an end of the common layer 427*b*.

The TFE layer 432 may be disposed above the substrate 401. The TFE layer 432 may cover the active area AA. The TFE layer 432 may cover at least a part of the inactive area IAA.

The TFE layer 432 may include a plurality of inorganic films 433 and a plurality of organic films 434. The plurality of inorganic films 433 and the plurality of organic films 434 may be alternately stacked. For example, the inorganic film 433 may include a first inorganic film 435, a second inorganic film 436, and a third inorganic film 437. The organic film 434 may include a first organic film 438 and a second organic film 439.

In the inactive area IAA, a barrier layer 402 may be disposed above the substrate 401. The barrier layer 402 may extend over each of the active area AA and the inactive area IAA. First to third insulating layers 445 to 447 may be disposed above the barrier layer 402. The first to third insulating layers 445 to 447 may each have at least one layer in a substantially vertical direction of the substrate 401. The first to third insulating layers 445 to 447 may be stacked in the substantially vertical direction of the substrate 401.

In one or more exemplary embodiments of the present invention, the first to third insulating layers 445 to 447 may extend over the active area AA and the inactive area IAA.

The first insulating layer 445 may be disposed above the first barrier layer 402. The first insulating layer 445 may be disposed on the same layer as the first gate insulating film 411. The first insulating layer 445 and the first gate insulating film 411 may be formed in the same process. The first insulating layer 445 and the first gate insulating film 411 may include substantially the same material.

The second insulating layer 446 may be disposed above the first insulating layer 445. The second insulating layer 446 may be disposed on the same layer as the second gate insulating film 413. The second insulating layer 446 and the second gate insulating film 413 may be formed in the same process. The second insulating layer 446 and the second gate insulating film 413 may include substantially the same material.

The third insulating layer 447 may be disposed above the second insulating layer 446. The third insulating layer 447 may be disposed on the same layer as the interlayer insulating film 415. The third insulating layer 447 and the interlayer insulating film 415 may be formed in the same process. The third insulating layer 447 and the interlayer insulating film 415 may include substantially the same material.

An insulating dam 440 may be disposed in the inactive area IAA. The insulating dam 440 may have at least one layer. The insulating dam 440 may surround the active area AA. A plurality of insulating dams 440 may be spaced apart from each other, for example, by certain intervals.

The insulating dam 440 may include one or more layers. The insulating dam 440 may include a first insulating dam 441, a second insulating dam 442 disposed above the first insulating dam 441, and a third insulating dam 443 disposed above the second insulating dam 442. In one or more exemplary embodiments of the present invention, the insulating dam 440 having a three-layered structure has been described in detail herein; however, exemplary embodiments of the present invention are not limited thereto.

The first insulating dam 441 may be disposed above the third insulating layer 447. The first insulating dam 441 may be disposed on the same layer as the planarization film 423. The first insulating dam 441 and the planarization film 423 may be formed in the same process. The first insulating dam 441 and the planarization film 423 may include substantially the same material.

The second insulating dam 442 may be disposed above the first insulating dam 441. The second insulating dam 442 may be disposed on the same layer as the pixel defining layer 424. The second insulating dam 442 and the pixel defining layer 424 may be formed in the same process. The second insulating dam 442 and the pixel defining layer 424 may include substantially the same material.

The third insulating dam 443 may be disposed above the second insulating dam 442. The third insulating dam 443 and the spacer 431 may be formed in the same process. The third insulating dam 443 and the spacer 431 may include substantially the same material.

In one or more exemplary embodiments of the present invention, the insulating dam 440 may have various structures and shapes.

Figure 5:
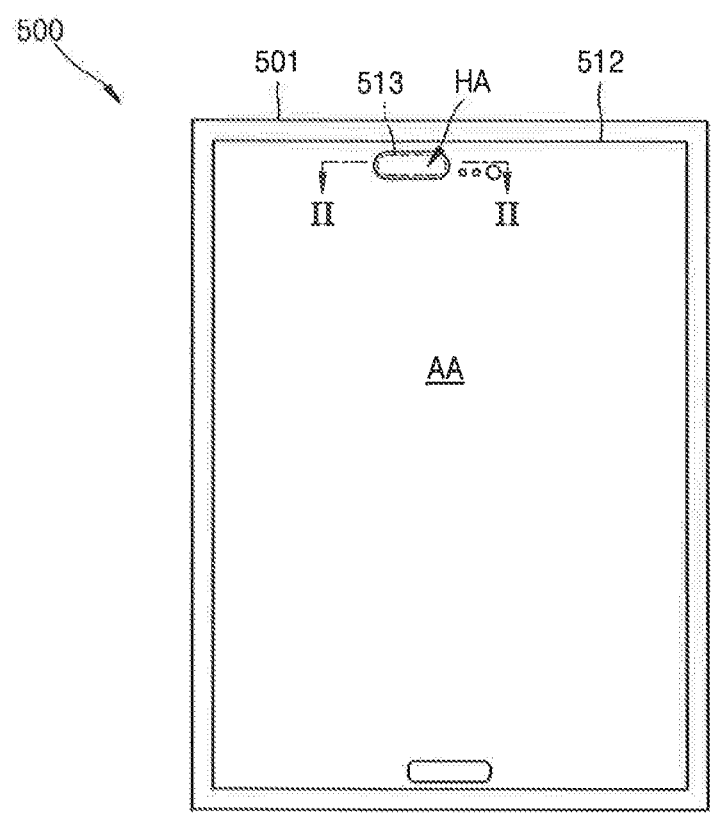
FIG. 5 is a plan view illustrating an organic light-emitting display device according to an exemplary embodiment of the present invention.
Figure 6:
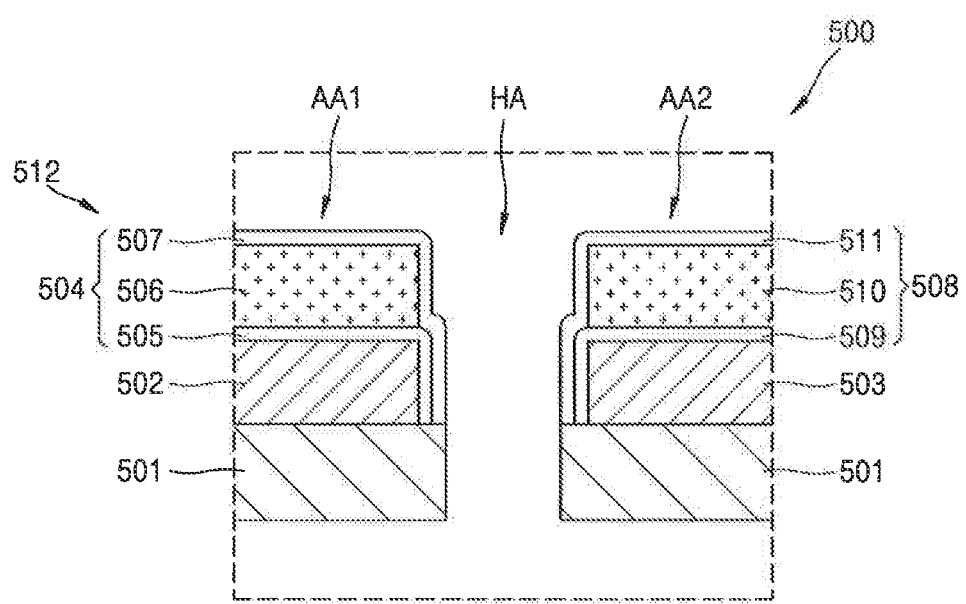
FIG. 6 is a cross-sectional view taken along a line II-II of FIG. 5 according to an exemplary embodiment of the present invention.

FIG. 5 is a plan view illustrating an organic light-emitting display device 500 according to an exemplary embodiment of the present invention. FIG. 6 is a cross-sectional view taken along a line of FIG. 5 according to an exemplary embodiment of the present invention.

Referring to FIGS. 5 and 6, an active area AA may be disposed above a substrate 501. The active area AA may include a first active area AA1 and a second active area AA2. The first active area AA1 may be connected to the second active area AA2.

A hole area HA may be disposed inside the active area AA. The hole area HA may be disposed between the first active area AA1 and the second active area AA2. The hole area HA may be surrounded by the active area AA.

The organic light emitting display device 500 may include the substrate 501, at least one display (for example, first and second displays 502 and 503), and a TFE layer 512. The at least one display may be disposed above the substrate 501. The TFE layer 512 may cover the first and second displays 502 and 503.

The first display 502 may be disposed above the first active area AA1. A first TEE layer 504 may be disposed above the first display 502. The first TEE layer 504 may include a first inorganic film 505, a first organic film 506, and a second inorganic film 506. The first organic film 506 may be disposed above the first inorganic film 505. The second inorganic film 506 may be disposed above the first organic film 506.

The second display 503 may be disposed above the second active area AA2. A second TFE layer 508 may be disposed above the second display 503. The second TFE layer 508 may include a first inorganic film 509, a first organic film 510, and a second inorganic film 511. The first organic film 510 may be disposed above the first inorganic film 509. The second inorganic film 511 may be disposed above the first organic film 510.

In one or more exemplary embodiments of the present invention, the first display 502 may be connected to the second display 503.

In one or more exemplary embodiments of the present invention, the first TEE layer 504 may be connected to the second TEE layer 508.

The hole area HA may penetrate each of the substrate 501 and the TFE layer 512. The hole area HA may be surrounded by the first active area AA1 and the second active area AA2.

In one or more exemplary embodiments of the present invention, electronic parts 513 may be disposed in the hole area HA. Examples of the electronic parts 513 disposed in the hole area HA may include a small camera, a speaker, a sensor such as an illumination sensor, or a button such as a home button.

In one or more exemplary embodiments of the present invention, a touch sensing unit, a polarization layer, or a cover window may be disposed in the hole area HA.

In the organic light-emitting display device having the hole area HA, a common layer or a common electrode may be formed above a substrate by using a mask having specific patterns corresponding to the hole area HA.

Figure 7:
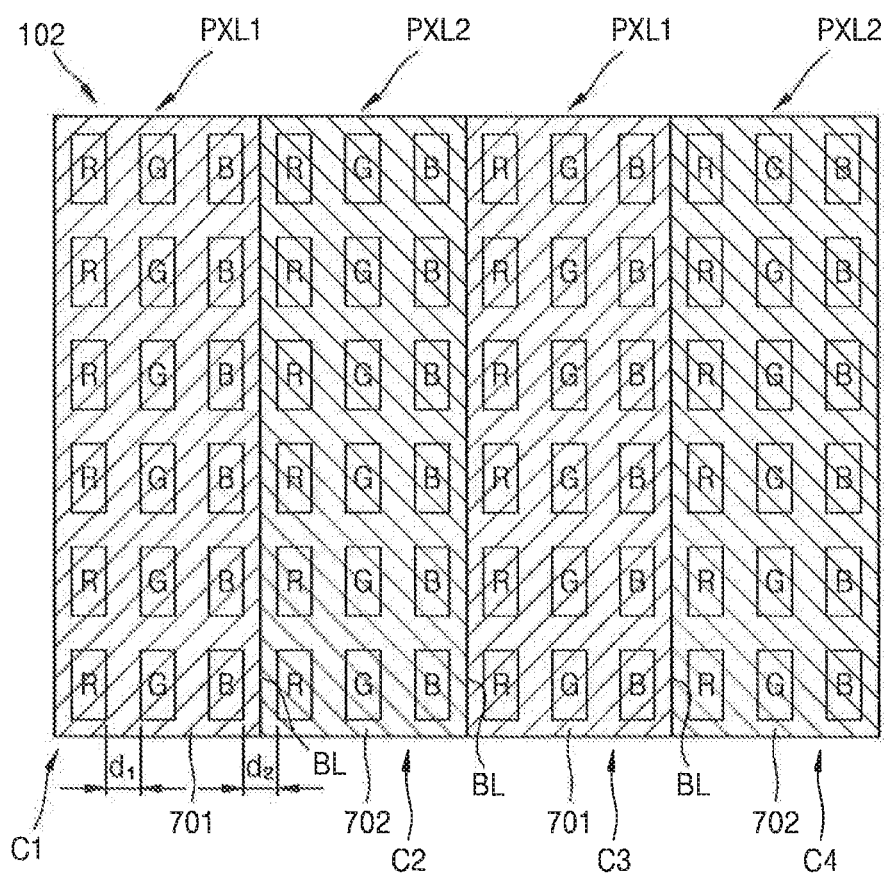
FIG. 7 is a plan view of pixels disposed in a portion A of FIG. 1 according to an exemplary embodiment of the present invention.

For example, referring to FIG. 7, a plurality of sub-pixels R, G, and B may be disposed in an active area 102. The plurality of sub-pixels R, G, and B may include a red sub-pixel R, a green sub-pixel G, and a blue sub-pixel B. The red, green, and blue sub-pixels R, G, and B may constitute one pixel. Organic emissive layers of red, green, and blue colors may be disposed in the sub-pixels R, G, and B, respectively. In one or more exemplary embodiments of the present invention, the sub-pixels may further include sub-pixels of other colors, in addition to the red sub-pixel R, the green sub-pixel G, and the blue sub-pixel B.

Pixels each having the plurality of sub-pixels R, G, and B may be disposed over substantially the entire active area 102. A deposition material for the common layer (427b of FIG. 4) or the common electrode (428 of FIG. 4) may be deposited on the pixels each having the plurality of sub-pixels R, G, and B.

A first deposition portion 701 for the common layer or the common electrode may be deposited on a plurality of first pixel groups PXL1. The plurality of first pixel groups PXL1 may be continuously disposed along one line on the active area 102, for example, each of odd lines C1 and C3. The first deposition portion 701 may be disposed in a stripe shape along each of the odd lines C1 and C3 of the active area 102.

A second deposition portion 702 for the common layer or the common electrode may be deposited on a plurality of second pixel groups PXL2. The plurality of second pixel groups PXL2 may be continuously disposed along one line on the active area 102, for example, each of even lines C2 and C4. The second deposition portion 702 may be disposed in a stripe shape along each of the even lines C2 and C4 of the active area 102.

The first deposition portion 701 for the common layer or the common electrode and the second deposition portion 702 for the common layer or the common electrode may be substantially the same patterns; however, exemplary embodiments of the present invention are not limited thereto. For example, the first deposition portion 701 and the second deposition portion 702 may have the substantially the same pattern or different various patterns as long as the first deposition portion 701 and the second deposition portion 703 are at least partially connected each other.

In one or more exemplary embodiments of the present invention, the first deposition portion 701 and the second deposition portion 702 may have stripe patterns, and an edge of the first deposition portion 701 having a straight line shape may contact an edge of the second deposition portion 702 having a straight line shape.

A boundary line BL may be disposed in a region where the first deposition portion 701 is connected to the second deposition portion 702. A boundary line BL may be disposed in each region where the first deposition portion 701 is connected to the second deposition portion 702. In one or more exemplary embodiments of the present invention, the boundary line BL may be a straight line.

In one or more exemplary embodiments of the present invention, an interval dl between the sub-pixels R, G, and B may be substantially equal to an interval d2 between a pair of adjacent pixels. For example, the first interval dl between the sub-pixels R, G, and B disposed in the odd lines C1 and C3 or the even lines C2 and C4 may be substantially equal to the second interval d2 between one pixel of the first pixel group PXL1 disposed in the odd lines C1 and C3 and one pixel of the second pixel group PXL2 disposed in the even lines C2 and C4 adjacent thereto. The first interval d1 and the second interval d2 may be an interval between the pixel defining layers (424 of FIG. 4) disposed around the sub-pixels R, G, and B.

In one or more exemplary embodiments of the present invention, the first interval d1 may be different from the second interval d2. For example, the interval d1 between the sub-pixels R, G, and B may be smaller than the interval d2 between the adjacent pixels.

Figure 8:
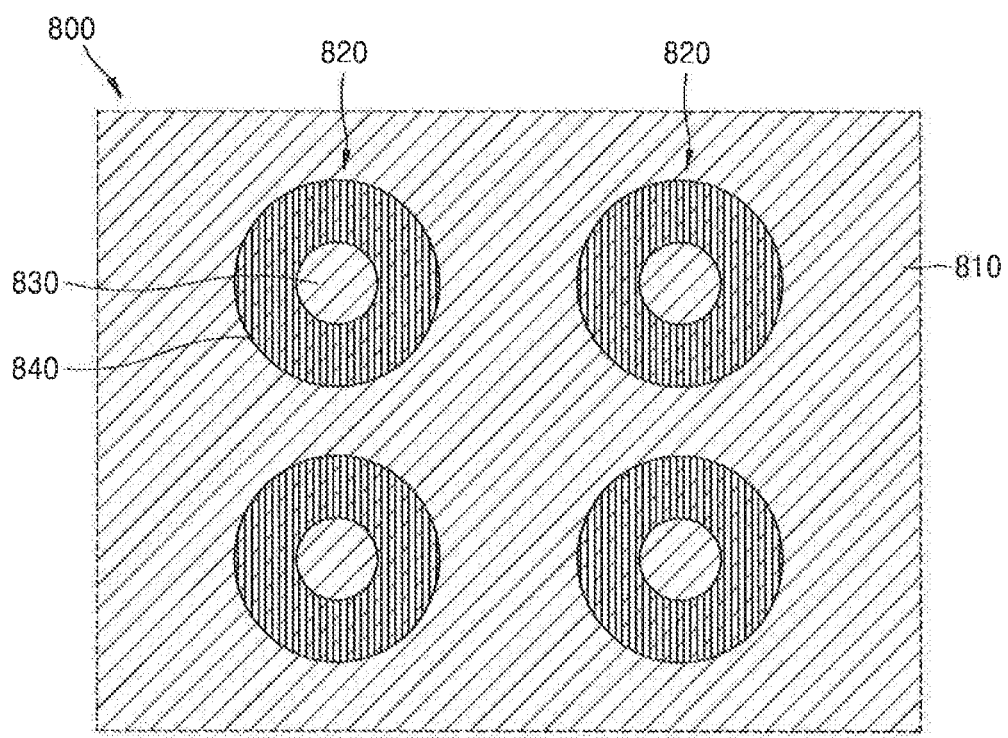
FIG. 8 is a plan view of a mask according to an exemplary embodiment of the present invention.
Figure 9:
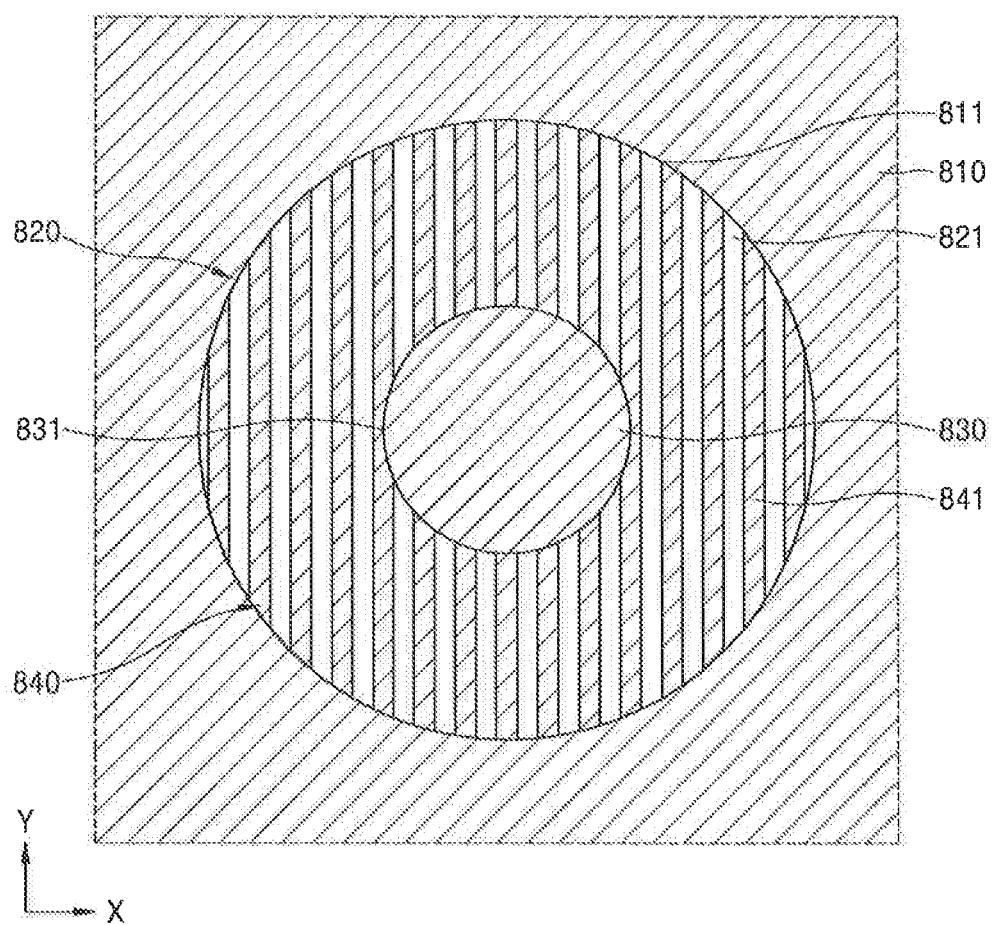
FIG. 9 is an enlarged plan view of a mask of FIG. 8 according to an exemplary embodiment of the present invention.

FIG. 8 is a plan view illustrating a mask according to an exemplary embodiment of the present invention. FIG. 9 is an enlarged plan view illustrating a mask of FIG. 8 according to an exemplary embodiment of the present invention.

Referring to FIGS. 8 and 9, the mask 800 may be a deposition mask for coating a deposition material for the common layer or the common electrode disposed above the sub-pixels R, G, and B illustrated in FIG. 7.

The mask 800 may include a mask body 810. The mask body 810 may include deposition holes 820. A deposition material for a common layer or a common electrode to be deposited may pass through the deposition holes 820. Referring to FIG. 8, a deposition mask for manufacturing four unit displays at substantially the same time has been described herein; however, exemplary embodiments of the present invention are not limited thereto.

A blocking plate 830 may be disposed inside the deposition hole 820, for example, to block movement of the deposition material for the common layer or the common electrode during a deposition process. The blocking plate 830 may be disposed to have an island shape. The blocking plate 830 may be a circular plate. In one or more exemplary embodiments of the present invention, the blocking plate 830 may have various shapes, such as an oval shape or a polygonal shape. A position of the blocking plate 830 may correspond to a position of the hole 103 on the substrate 101. A size of the blocking plate 830 may correspond to a size of the hole 103.

The deposition hole 820 may have a loop shape. In one or more exemplary embodiments of the present invention, the deposition hole 820 may have a ring shape. A position of the deposition hole 820 may correspond to a position of the active area 102 on the substrate 101. A size of the deposition hole 820 may correspond to a size of the active area 102.

The mask body 810 and the blocking plates 830 may be connected to each other, for example, by a plurality of bridges 840. The bridges 840 may divide the deposition hole 820 into a plurality of spaces.

Bridge portions 841 of the bridges 840 may be disposed across the deposition hole 820. The bridge portions 841 may be disposed across the deposition hole 820 in a first direction (e.g., a Y-axis direction). The bridge portions 841 may have a stripe shape. The bridge portions 841 may connect an inner peripheral surface 811 of the mask body 810 surrounding the deposition hole 820 to an outer peripheral surface 831 of the blocking plate 830.

An interval 821 between the bridge portions 841 may correspond to each space where the deposition hole 820 is divided. The interval 821 between the bridge portions 841 may correspond to a size of the pixel group having the plurality of sub-pixels R, G, and B disposed along one line on the active area 102 of FIG. 7. For example, the interval 821 between the bridge portions 841 may correspond to a size of the pixel group having the plurality of sub-pixels R, G, and B disposed along the odd lines C1 and C3 of the active area 102 and the even lines C2 and C4 of the active area 102. For example, a length of the interval 821 (e.g., a size in the Y-axis direction) may correspond to a length of the pixel group having the sub-pixels R, G, and B disposed on one line, and a width of the interval 821 (e.g., a size in an X-axis direction) may correspond to a width of one pixel of the pixel group.

The bridge portions 841 may extend in the first direction (e.g., the Y-axis direction) of the mask body 810 corresponding to the odd lines C1 and C3 and the even lines C2 and C4 of the active area 102. The bridge portions 841 may be spaced apart from each other by the interval 821 in the second direction (e.g., the X-axis direction) of the mask body 810.

In one or more exemplary embodiments of the present invention, the deposition material for the common layer or the common electrode may be deposited on the pixel having the sub-pixels R, G, and B disposed on the active area 102 through two steps or operations by using the mask 800.

A process of forming a common layer or a common electrode on an organic light-emitting display device having a hole area HA by using the mask 800 will be described in more detail below.

Figure 10A:
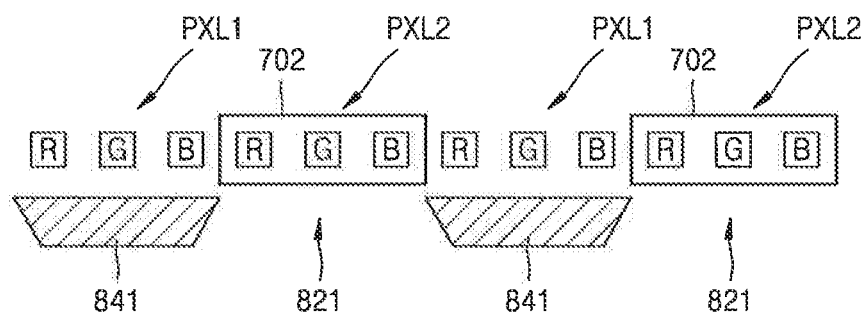
FIG. 10A is a cross-sectional view illustrating a first operation of forming a deposition portion according to an exemplary embodiment of the present invention.
Figure 10B:
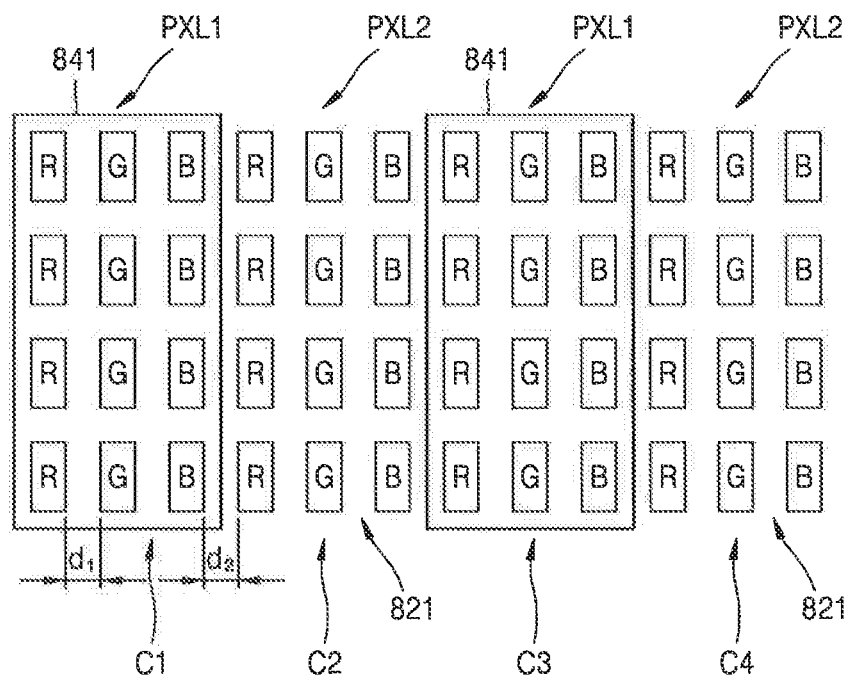
FIG. 10B is a cross-sectional view of FIG. 10A according to an exemplary embodiment of the present invention.
Figure 11A:
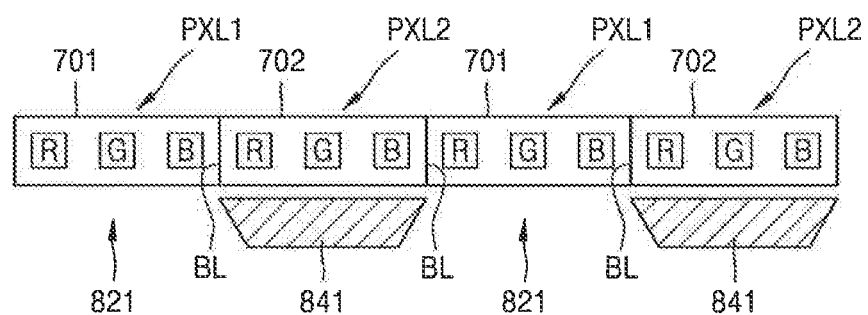
FIG. 11A is a cross-sectional view illustrating a second operation of forming a deposition portion of FIG. 10A according to an exemplary embodiment of the present invention.
Figure 11B:
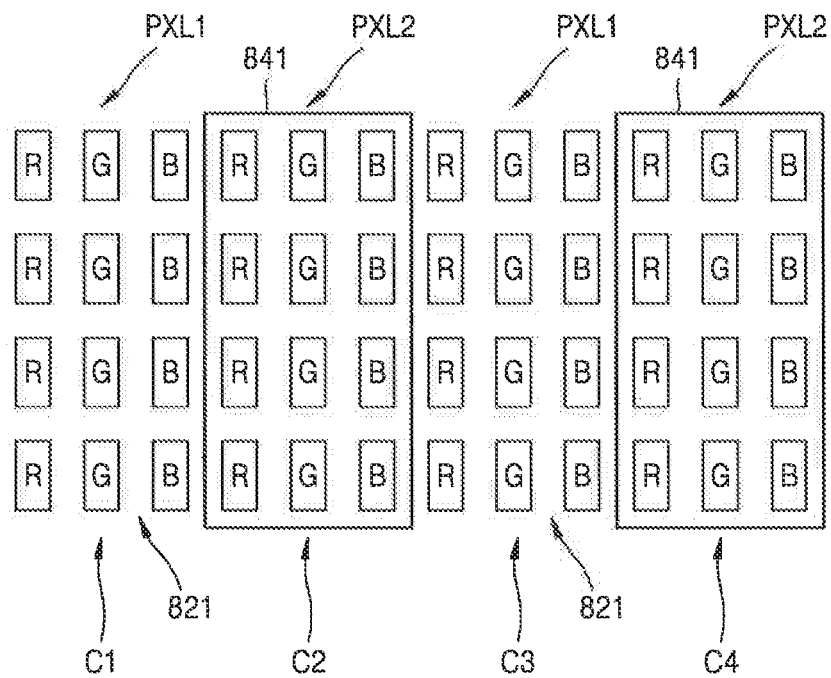
FIG. 11B is a cross-sectional view of FIG. 11A according to an exemplary embodiment of the present invention.

FIG. 10A is a cross-sectional view illustrating a first operation of forming a deposition portion according to an exemplary embodiment of the present invention. FIG. 10B is a cross-sectional view of FIG. 10A according to an exemplary embodiment of the present invention. FIG. 11A is a cross-sectional view illustrating a second operation of forming a deposition portion of FIG. 10A according to an exemplary embodiment of the present invention. FIG. 11B is a cross-sectional view of FIG. 11A according to an exemplary embodiment of the present invention.

Referring to FIGS. 10A and 10B, the bridge portions 841 of the mask 800 of FIG. 8 may be arranged on the first pixel groups PXL1 disposed along the odd lines C1 and C3 of the active area 102 of FIG. 7. The interval 821 between the bridge portions 841 may be arranged on the second pixel groups PXL2 disposed along the even lines C2 and C4 of the active area 102.

In one or more exemplary embodiments of the present invention, the first interval d1 between the sub-pixels R, G, and B disposed in the odd lines C1 and C3 or the even lines C2 and C4 may be substantially equal to each of the second interval d2 between one pixel of the first pixel group PXL1 disposed in the odd lines C1 and C3 and one pixel of the second pixel group PXL2 disposed in the even lines C2 and C4 adjacent thereto.

A deposition material for the common layer or the common electrode may penetrate through the interval 821 between the bridge portions 841. Accordingly, as illustrated in FIG. 10A, a second deposition portion 702 for the common layer or the common electrode may be deposited on the second pixel groups PXL2 (e.g., the first operation).

Referring to FIGS. 11A and 11B, the bridge portions 841 may be arranged on the second pixel groups PXL2 disposed along the even lines C2 and C4 of the active area 102 of FIG. 7. The interval 821 between the bridge portions 841 may be disposed on the first pixel groups PXL1 disposed along the odd lines C1 and C3 of the active area 102.

A deposition material for the common layer or the common electrode may penetrate through the interval 821 between the bridge portions 841. Accordingly, as illustrated in FIG. 11A, a first deposition portion 701 for the common layer or the common electrode may be deposited on the first pixel groups PXL1 (e.g., the second operation).

The first deposition portion 701 and the second deposition portion 702 may be deposited on the pixel groups PXL1 and PXL2 each having the plurality of sub-pixels through the two operations or steps.

The first deposition portion 701 and the second deposition portion 702 may be at least partially connected to each other. A boundary line BL may be disposed in a region where the first deposition portion 701 and the second deposition portion 702 are connected to each other.

Figure 12A:
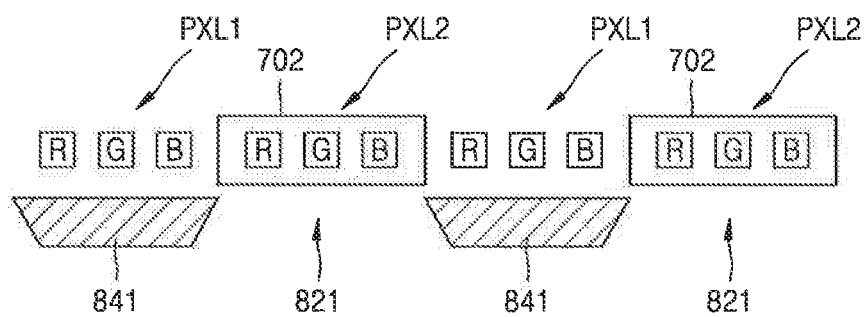
FIG. 12A is a cross-sectional view illustrating a first operation of forming a deposition portion according to an exemplary embodiment of the present invention.
Figure 12B:
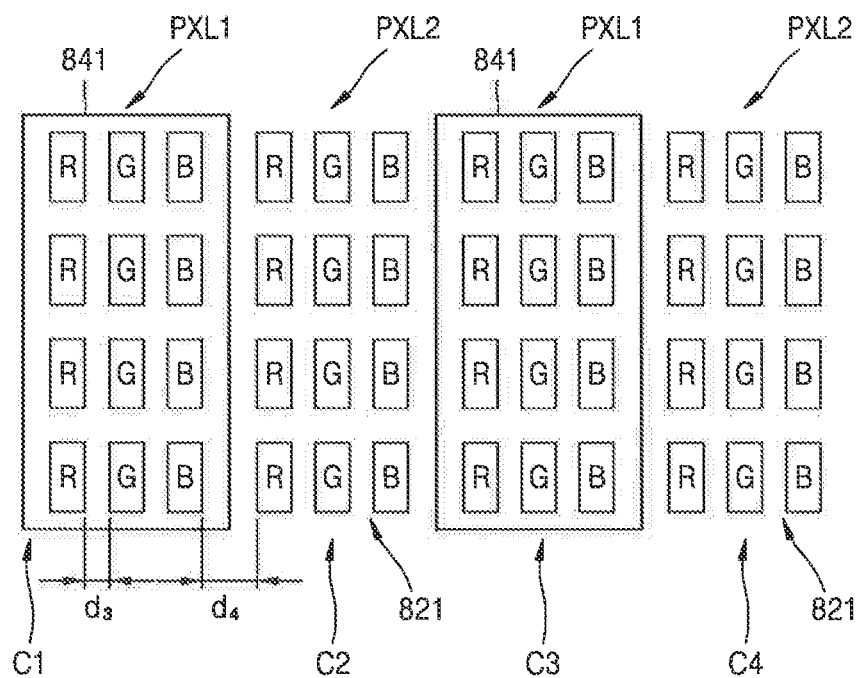
FIG. 12B is a cross-sectional view of FIG. 12A according to an exemplary embodiment of the present invention.
Figure 13A:
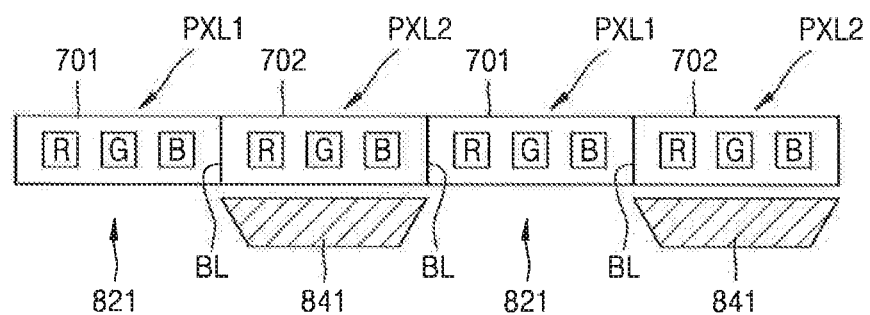
FIG. 13A is a cross-sectional view illustrating a second operation of forming a deposition portion of FIG. 12A according to an exemplary embodiment of the present invention.
Figure 13B:
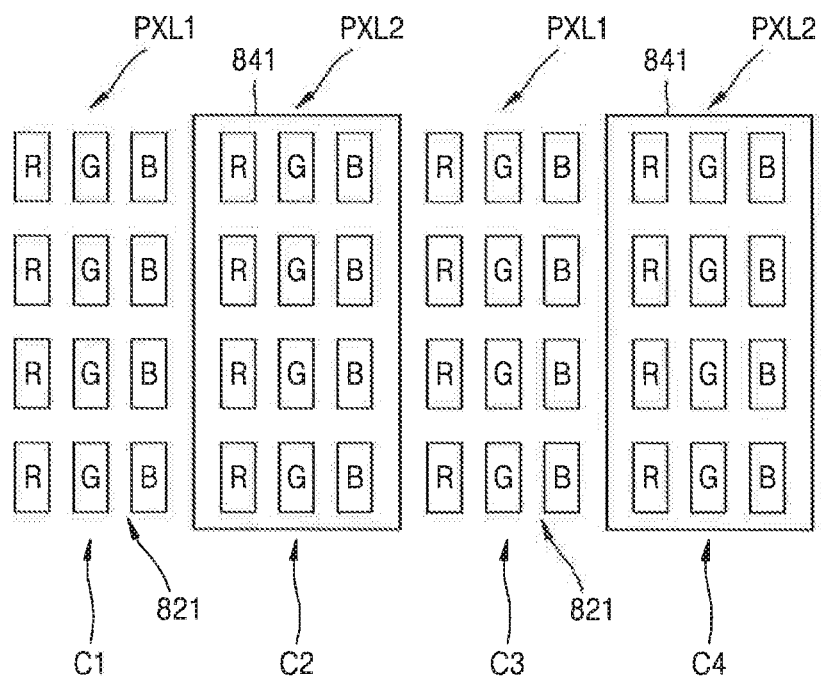
FIG. 13B is a cross-sectional view of FIG. 13A according to an exemplary embodiment of the present invention.

FIG. 12A is a cross-sectional view illustrating a first operation of forming a deposition portion according to an exemplary embodiment of the present invention. FIG. 12B is a cross-sectional view of FIG. 12A according to an exemplary embodiment of the present invention. FIG. 13A is a cross-sectional view illustrating a second operation of forming the deposition portion of FIG. 12A according to an exemplary embodiment of the present invention. FIG. 13B is a cross-sectional view of FIG. 13A according to an exemplary embodiment of the present invention.

Referring to FIGS. 12A and 12B, a second deposition portion 702 for the common layer or the common electrode may be deposited on the second pixel groups PXL2 through a first operation.

A third interval d3 between the sub-pixels R, G, and B disposed in the odd lines C1 and C3 or the even lines C2 and C4 may be different from a fourth interval d4 between one pixel of the first pixel group PXL1 disposed in the odd lines C1 and C3 and one pixel of the second pixel group PXL2 disposed in the even lines C2 and C4 adjacent thereto. In one or more exemplary embodiments of the present invention, the third interval d3 between the sub-pixels R, G, and B may be narrower than the fourth interval d4 between one pixel of the first pixel group PXL1 and one pixel of the second pixel group PXL2 adjacent thereto.

When the third interval d3 between the sub-pixels R, G, and B is relatively narrow and the fourth interval d4 between one pixel of the first pixel group PXL1 and one pixel of the second pixel group PXL2 adjacent thereto is relatively wide, it may be relatively easy to secure a margin capable of depositing the depositing material for the common layer or the common electrode. Thus, an alignment of the substrate 101 and the mask 800 may be realized.

Referring to FIGS. 13A and 13B, a first deposition portion 701 for the common layer or the common electrode may be deposited on the first pixel groups PXL1 through a second operation.

The first deposition portion 701 and the second deposition portion 702 may be deposited on the pixel groups PXL1 and PXL2 each having the plurality of sub-pixels through the two operations or steps. A boundary line BL may be disposed in each region, for example, where the first deposition portion 701 is connected to the second deposition portion 702.

Figure 15:
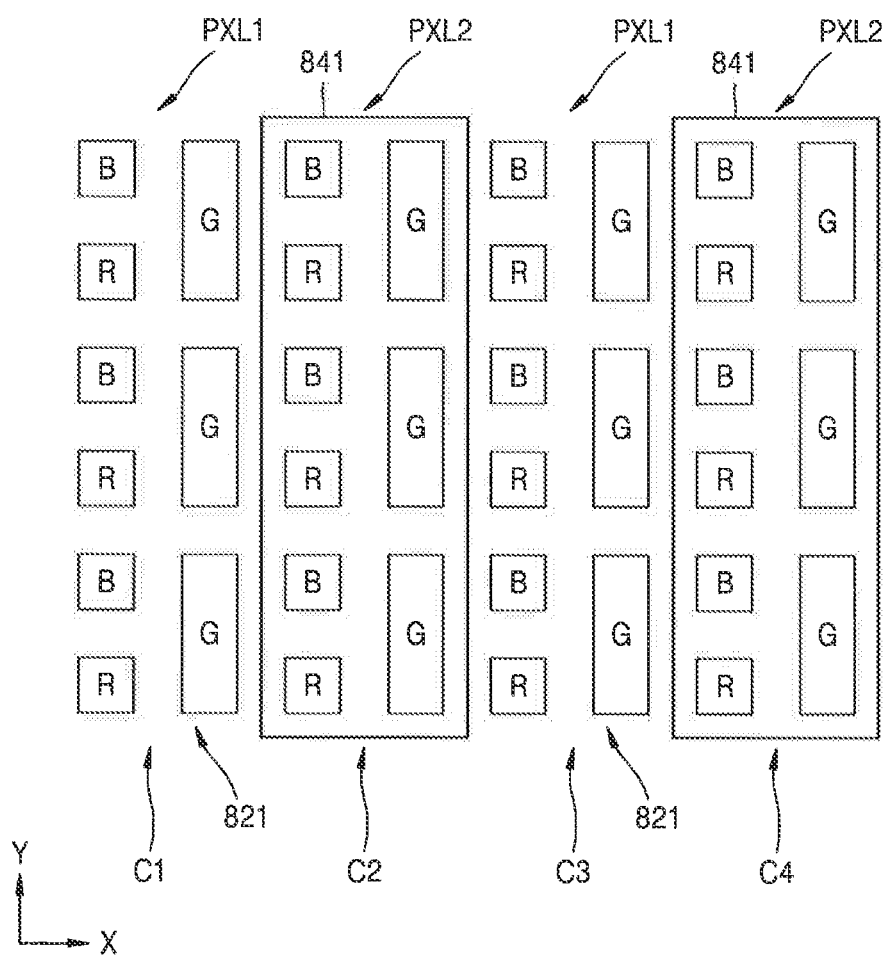
FIG. 15 is a cross-sectional view illustrating a second operation of forming a deposition portion of FIG. 14 according to an exemplary embodiment of the present invention.

FIG. 14 is a cross-sectional view illustrating a first operation of forming a deposition portion according to an exemplary embodiment of the present invention. FIG. 15 is a cross-sectional view illustrating a second operation of forming a deposition portion of FIG. 14 according to an exemplary embodiment of the present invention.

Referring to FIG. 14, the bridge portions 841 may be arranged on the first pixel groups PXL1 disposed along the odd lines C1 and C3 of the active area 102 of FIG. 7. The interval 821 between the bridge portions 841 may be disposed on the second pixel groups PXL2 disposed along the even lines C2 and C4 of the active area 102.

Patterns of sub-pixels R, G, and B may be disposed differently from patterns of the above-described sub-pixels R, G, and B. For example, a green sub-pixel G may have a stripe shape with a first length in a first direction (e.g., the Y-axis direction). A blue sub-pixel B and a red sub-pixel R may be disposed adjacent to the red sub-pixel G in a second direction (e.g., the X-axis direction). The blue sub-pixel B and the red sub-pixel R may each have a rectangular shape vertically separately disposed in the first direction (e.g., the Y-axis direction). A total length of the blue sub-pixel B and the red sub-pixel R may be a first length or less.

In one or more exemplary embodiments of the present invention, a fifth interval d5 between the sub-pixels R, G, and B disposed in the odd lines C1 and C3 or the even lines C2 and C4 may be substantially equal to a sixth interval d6 between one pixel of the first pixel group PXL1 disposed in the odd lines C1 and C3 and one pixel of the second pixel group PXL2 disposed in the even lines C2 and C4 adjacent thereto.

In one or more exemplary embodiments of the present invention, the fifth interval d5 between the sub-pixels R, G, and B may be narrower than the sixth interval d6 between one pixel of the first pixel group PXL1 and one pixel of the second pixel group PXL2 adjacent thereto.

A deposition material for the common layer or the common electrode may penetrate through the interval 821 between the bridge portions 841. Accordingly, a deposition material for the common layer or the common electrode may be deposited on the second pixel groups PXL2 (e.g., the first operation).

Referring to FIG. 5, the bridge portions 841 may be arranged on the second pixel groups PXL2 disposed along the even lines C2 and C4 of the active area 102 of FIG. 7. The interval 821 between the bridge portions 841 may be disposed on the first pixel groups PXL1 disposed along the odd lines C1 and C3 of the active area 102.

A deposition material for the common layer or the common electrode may penetrate through the interval 821 between the bridge portions 841. Accordingly, a deposition material for the common layer or the common electrode may be deposited on the first pixel groups PXL1 (e.g., the second operation).

The first deposition materials for the common layer or the common electrode may be deposited on the pixel groups PXL1 and PXL2 each having the plurality of sub-pixels through the two operations or steps.

In the organic light-emitting display device, the mask for manufacturing the same, and the method of manufacturing the same according to one or more exemplary embodiments of the present invention, the common layer or the common electrode may be formed on the pixel groups through two operations or steps by using the mask having a specific shape.

It should be understood that exemplary embodiments described herein should be considered in a descriptive sense only and not for purposes of limitation. Descriptions of features or aspects within each embodiment should typically be considered as available for other similar features or aspects in other exemplary embodiments of the present invention.

While one or more exemplary embodiments of the present invention have been described with reference to the figures, it will be understood by those of ordinary skill in the art that various changes in form and details may be made therein without departing from the spirit and scope of the present invention.

What is claimed is:

1. A mask for manufacturing a display device, the display device including at least one hole area disposed on a substrate, a pixel electrode, an intermediate layer including an organic emissive layer and at least one common layer, and a common electrode, the mask comprising:
    a mask body having a deposition hole;
    a blocking plate disposed in the deposition hole in an island shape; and
    a plurality of bridges, configured to connect the mask body to the blocking plate and/or divide the deposition hole,
    wherein each of the plurality of bridges includes a plurality of bridge portions disposed across the deposition hole,
    wherein each of the plurality of bridge portions is thinner than the blocking plate, and each of the plurality of bridge portions is laterally separated from one another, and
    pairs of the plurality of bridge portions are connected to the mask body from opposite sides of the blocking plate.

2. The mask of claim 1, wherein some of the plurality of bridge portions connect an inner peripheral surface of the mask body surrounding the deposition hole to an outer peripheral surface of the blocking plate, and others of the plurality of bridge portions connect the inner peripheral surface of the mask body surrounding the deposition hole to itself across the deposition hole, and an interval between each of the plurality of bridge portions corresponds to each space where the deposition hole is divided.

3. The mask of claim 2, wherein the interval between the bridge portions corresponds to a size of a pixel group having a plurality of sub-pixels disposed along a first line on an active area of the substrate.

4. The mask of claim 3, wherein the bridge portions have a stripe shape extending in a first direction of the mask body corresponding to the first line on the active area, and the bridge portions are spaced apart from each other by the interval in a second direction.

5. The mask of claim 1, wherein a position of the blocking plate corresponds to a position of a hole on the substrate.

6. The mask of claim 1, wherein a position of the deposition hole corresponds to a position of the active area on the substrate, and the deposition hole has a loop shape.

* * * * *